(12) United States Patent
Arimoto

(10) Patent No.: US 6,442,078 B1
(45) Date of Patent: Aug. 27, 2002

(54) SEMICONDUCTOR MEMORY DEVICE HAVING STRUCTURE IMPLEMENTING HIGH DATA TRANSFER RATE

(75) Inventor: Kazutami Arimoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 51 days.

(21) Appl. No.: 09/661,451

(22) Filed: Sep. 13, 2000

(30) Foreign Application Priority Data

Sep. 21, 1999 (JP) .......................................... 11-267122

(51) Int. Cl.$^7$ .............................................. G11C 16/04
(52) U.S. Cl. ................ 365/189.08; 365/63; 365/230.03
(58) Field of Search ...................... 365/189.08, 230.03, 365/63

(56) References Cited

U.S. PATENT DOCUMENTS

| 5,280,441 | A | | 1/1994 | Wada et al. ................... 365/63 |
| 5,831,924 | A | * | 11/1998 | Nitta et al. ............ 365/230.03 |
| 6,023,428 | A | * | 2/2000 | Tran ....................... 365/189.01 |
| 6,067,271 | A | * | 5/2000 | Isa ......................... 365/230.03 |
| 6,078,542 | A | * | 6/2000 | Tomishima ............ 365/230.03 |
| 6,118,715 | A | * | 9/2000 | Arimoto ...................... 365/205 |
| 6,134,153 | A | * | 10/2000 | Lines et al. ............ 365/189.02 |

FOREIGN PATENT DOCUMENTS

JP          4-228188          8/1992

* cited by examiner

*Primary Examiner*—Richard Elms
*Assistant Examiner*—Tuan T. Nguyen
(74) *Attorney, Agent, or Firm*—McDermott, Will & Emery

(57) ABSTRACT

The inventive semiconductor memory device comprises an interface area transmitting/receiving data to/from an external device, an address-system circuit receiving an address signal from the interface area, a memory cell array (subarray), a preamplifier/write driver for writing data received from the interface area in the subarray or outputting data read from the subarray to the interface area, and an internal data bus transmitting write data and read data. The address-system circuit and the preamplifier/write driver are arranged between the interface area and the memory cell array. The internal data bus is arranged in a row direction. The length of a wire connecting each circuit with the interface area can be minimized, and a high data transfer rate is implemented.

12 Claims, 16 Drawing Sheets

FIG. 15

SEMICONDUCTOR MEMORY DEVICE HAVING STRUCTURE IMPLEMENTING HIGH DATA TRANSFER RATE

BACKGROUND OF THE INVENTION

1. Field of the Invention

The present invention relates to a semiconductor memory device, and more particularly, it relates to a semiconductor memory device having a structure suitable for a memory-combined LSI having a large internal bus width.

2. Description of the Prior Art

A memory/logic merged LSI formed by integrating a logic circuit and a memory core part operated by the logic circuit on a single semiconductor substrate is recently developed.

In such a memory/logic merged LSI, the memory core part captures a number of write data from the logic circuit through a number of I/O nodes (I/O: input/output) or transfers a number of read data to the logic circuit. Thus, a large quantity of data can be processed at a high speed.

The memory/logic merged LSI has a possibility of implementing an extremely high data transfer rate by enlarging an internal bus width (bit number of simultaneously transferred data) for transferring data between the logic circuit and the memory core part and improving the operating frequency.

When increasing the capacity of memory cells for processing a large quantity of data, however, the scale of gates selectively connecting a number of internal data buses transferring write data and read data with bit lines is disadvantageously increased.

Thus, while the operating frequency tends to improve following recent improvement of the performance of transistors, increase of the memory capacity or the scale of the gates results in delay in wires connecting elements of the memory core part. Such wiring delay degrades the operating performance of the memory core part as well as the throughput of the memory/logic merged LSI itself.

SUMMARY OF THE INVENTION

Accordingly, an object of the present invention is to provide a semiconductor memory device capable of implementing a high data transfer rate by relaxing influence by wiring delay resulting from increase of the memory capacity.

The semiconductor memory device according to the present invention comprises a memory cell array including a plurality of word lines arranged in a row direction, a plurality of bit lines arranged in a column direction and a plurality of memory cells, an interface area for transmitting/receiving signals to/from an external device, and a memory operation circuit arranged between the interface area and the memory cell array for writing data received from the interface area in the memory cell array and reading data from the memory cell array to output the data to the interface area.

According to the aforementioned semiconductor memory device, therefore, a circuit group related to memory operations is arranged in the vicinity of the interface area, and hence no wire may be extended. Thus, a high data transfer rate can be implemented between the semiconductor memory device and the external device by relaxing influence exerted by wiring delay.

Preferably, the semiconductor memory device further comprises an internal data bus arranged in the row direction for transmitting write data output from the memory operation circuit to the memory cell array in a write operation and transmitting read data read from the memory cell array to the memory operation circuit in a read operation and a sense amplifier block including a plurality of sense amplifiers provided in correspondence to the plurality of bit lines for amplifying the potentials of the corresponding bit lines and a plurality of input/output gates provided in correspondence to the plurality of sense amplifiers respectively for transmitting data between the corresponding bit lines and the internal data bus.

Alternatively, the semiconductor memory device preferably further comprises an internal data bus arranged in the row direction for transmitting/receiving data to/from the memory cell array, the memory operation circuit preferably includes a selection circuit selecting a memory cell subjected to a write operation and a read operation on the basis of an address signal received from the interface area and a data input/output circuit outputting write data to the internal data bus on the basis of input data received from the interface area in the write operation and outputting output data to the interface area on the basis of read data received from the internal data bus in the read operation.

Alternatively, the semiconductor memory device preferably further comprises an internal data bus arranged in the row direction for transmitting write data output from the memory operation circuit in a write operation and transmitting read data read from the memory cell array to the memory operation circuit in a read operation and a sense amplifier block including a plurality of sense amplifiers provided in correspondence to the plurality of bit lines respectively for amplifying the potentials of the corresponding bit lines and a plurality of input/output gates provided in correspondence to the plurality of bit lines respectively for electrically connecting/disconnecting the corresponding bit lines to/from the internal data bus, and the memory operation circuit preferably includes a selection circuit selecting a memory cell subjected to the write operation and the read operation on the basis of an address signal received from the interface area and a data input/output circuit outputting the write data to the internal data bus on the basis of input data received from the interface area in the write operation and outputting output data to the interface area on the basis of the read data received from the internal data bus in the read operation.

According to the aforementioned semiconductor memory device, therefore, an address-system circuit and a preamplifier/write driver, for example, are arranged in the vicinity of the interface area, whereby no wire may be extended. Further, the internal data bus is arranged in the row direction, so that the data bus length is not influenced also when the memory cell array is increased in size in the column direction. Thus, the semiconductor memory device is particularly suitable for a memory array, having a large internal bus width, of a memory/logic merged LSI.

More preferably, the internal data bus includes a local data bus arranged on the sense amplifier block and electrically connected with a bit line corresponding to the memory cell selected by the selection circuit, a global data bus arranged in the row direction and connected with the data input/output circuit, and a connection line connecting the local data bus and the global data bus with each other. In particular, the memory cell array includes a split area arranged in the column direction and a plurality of subarrays split by the split area, and the connection line is arranged on the split area in the column direction. In particular, each of the plurality of word lines is split into a plurality of subword lines, and the split area is an area for driving a subword line corresponding to the selected memory cell. Alternatively, the split area is an area for pile-driving each of the plurality of word lines.

Therefore, the internal data bus arranged in the row direction can be implemented by layering the internal data bus.

Further, a bus connection line can be arranged through the split area (a subword driver area in the case of a split word line system or a word line pile-driving area in the case of a general word line system, for example) extending in the column direction of the memory cell array.

More preferably, the interface area includes a first interface area having an address area receiving the address signal from the external device and a second interface area having a data input/output area for receiving the input data from the external device and outputting the output data to the external device, the selection circuit is arranged between the first interface area and an end of the memory cell array, and the data input/output circuit is arranged between the second interface area and another end of the memory cell array.

Alternatively, the interface area more preferably includes a first interface area having an address area for receiving the address signal from the external device and a data input area for receiving the input data from the external device and a second interface area having a data output area for outputting the output data to the external device, the data input/output circuit more preferably includes a data input circuit outputting the write data to the internal data bus on the basis of the input data and a data output circuit outputting the output data to the data output area on the basis of the read data, the selection circuit and the data input circuit are more preferably arranged on an end of the memory cell array, and the data output circuit is arranged on another end of the memory cell array. In particular, the internal data bus includes a write data bus provided in correspondence to the data input circuit for transmitting the write data and a read data bus provided in correspondence to the data output circuit for transmitting the read data.

According to the aforementioned semiconductor memory device, therefore, high-speed data reading is implemented by arranging a circuit (address-system circuit) designating the memory cell subjected to the write operation and the read operation and a data-system circuit group (preamplifier/write driver) through the memory cell array.

Further, the circuit (address-system circuit) designating the memory cell subjected to the write operation and the read operation and a data input system circuit (preamplifier) and a data output system circuit (write driver) are arranged through the memory cell array. Following this, the internal data bus for reading and the internal data bus for writing are provided in the row direction respectively. Thus, high-speed data reading and high-speed data writing are implemented.

More preferably, the plurality of input/output gates are split into a plurality of groups, and the semiconductor memory device further comprises a plurality of local column selection lines provided in correspondence to the plurality of groups respectively for turning on/off the input/output gates included in the corresponding groups, a plurality of main column selection lines provided in correspondence to the plurality of local column selection lines respectively and driven by the selection circuit, and a plurality of connection lines for connecting the plurality of local column selection lines with the corresponding main column selection lines respectively.

According to the aforementioned semiconductor memory device, therefore, the number of input/output gates driven by a single local column selection line can be reduced (the load capacity of the local column selection line can be reduced) by splitting a column selection line (local column selection lines) switching the I/O gates provided in the sense amplifier block. Also when the gate number is increased, therefore, a high-speed operation is implemented.

Preferably, the memory cell array is split into a plurality of banks capable of operating independently of each other, and a plurality of sense amplifier blocks and a plurality of internal data buses are provided in correspondence to the plurality of banks respectively. Alternatively, the memory cell array is split into a plurality of banks capable of operating independently of each other, each of the plurality of banks is split into a plurality of subarrays, and a plurality of sense amplifier blocks and a plurality of internal data buses are provided in correspondence to the plurality of subarrays respectively.

Also when the memory cell array has a bank structure, therefore, a high data transfer rate is implemented. Further, power consumption in the memory cell array can be reduced by structuring the banks to operate in a split manner.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a diagram for illustrating an exemplary structure of internal data buses according to the seventh embodiment of the present invention.

DESCRIPTION OF THE PREFERRED EMBODIMENTS

Figure 1:
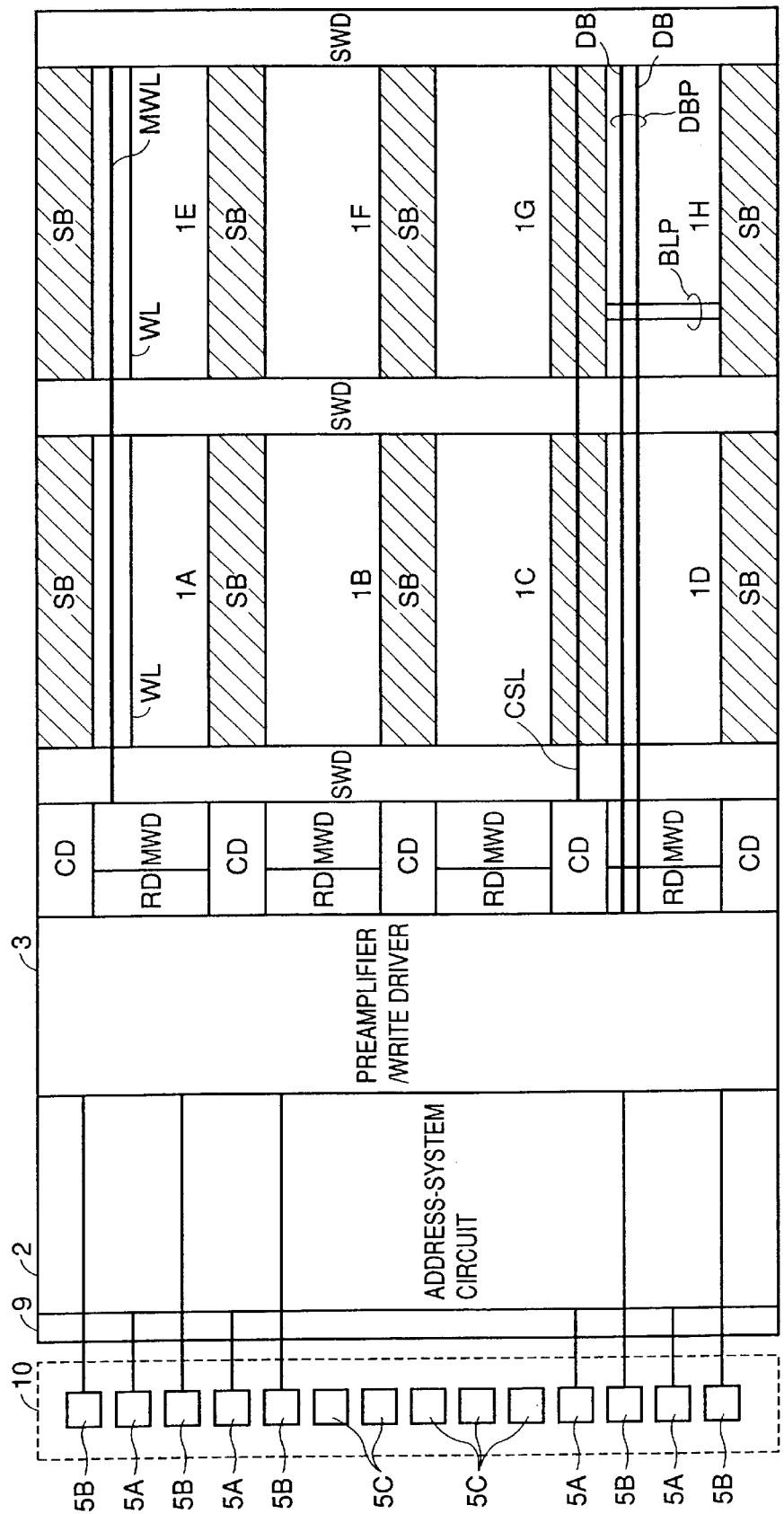
FIG. 1 is a diagram for illustrating an outline of the structure of a semiconductor memory device according to a first embodiment of the present invention.

Embodiments of the semiconductor memory device according to the present invention are now described with reference to the drawings. In the drawings, identical components are denoted by the same reference numerals or symbols, and redundant description is not repeated.

First Embodiment

A semiconductor memory device according to a first embodiment of the present invention is described with reference to FIG. 1. The semiconductor memory device shown in FIG. 1 comprises an interface area 10, an address-system circuit 2, a preamplifier/write driver 3, a control circuit 9, row decoders RD, column decoders CD, main word drivers MWD, subword drivers SWD, sense amplifier blocks SB and subarrays 1A to 1H.

The interface area 10 is an area for transmitting/receiving signals to/from an external device. Referring to FIG. 1, the interface area 10 includes address-system areas, data-system areas and remaining signal areas for transmitting/receiving signals. The address-system areas include a plurality of address areas 5A (address nodes 5A) receiving address signals. The data-system areas include a plurality of I/O areas 5B (I/O nodes 5B) for transmitting/receiving data to/from the subarrays. The signal areas include a plurality of signal areas 5C (signal nodes 5C) receiving a power supply voltage, control signals and the like. The I/O areas are formed by a number of, e.g., 128, 256, 512, 1K or 2K I/O nodes 5B. According to the first embodiment of the present invention, a plurality of internal data buses DB corresponding to the plurality of I/O nodes 5B are arranged in a row direction. Referring to FIG. 1, symbol DBP denotes a pair of internal data buses.

The address-system circuit 2 amplifies or inverts the address signals received in the address node 5A and thereafter supplies the amplified or inverted signals to the row decoders RD and the column decoders CD. The row decoders RD decode row address signals supplied from the address-system circuit 2. The column decoders CD decode column address signals supplied from the address-system circuit 2 and output column selection signals for selecting columns to a column selection line CSL. The column selection line CSL opens/closes I/O gates described later in the sense amplifier blocks SB. Therefore, the column selection line CSL is arranged in the sense amplifier blocks SB, and the column decoders CD are locally arranged on extension of the sense amplifier blocks SB.

Each of the subarrays 1A to 1H includes a plurality of memory cells arranged in rows and columns, word lines corresponding to the rows and bit lines corresponding to the columns. The word lines are in a hierarchical structure. Each of the subarrays, which is a DRAM (dynamic random access memory) in the following description, may alternatively have another memory structure.

Figure 2:
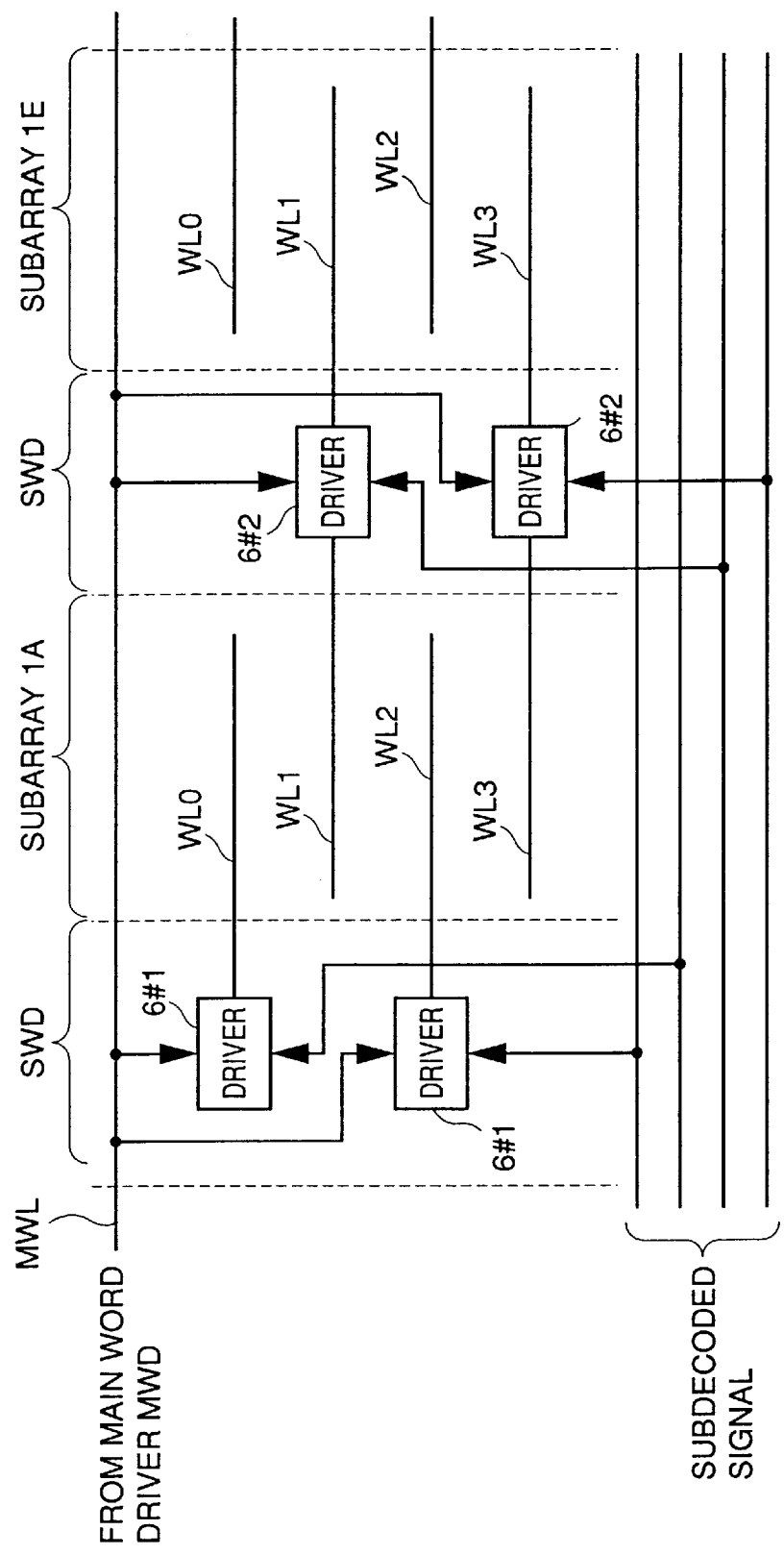
FIG. 2 is a diagram for illustrating the structure of word lines.

The structure of the word lines is now described with reference to FIG. 2. FIG. 2 representatively shows the subarrays 1A and 1E. Referring to FIG. 2, the main word driver MWD drives a corresponding main word line MWL in response to an output of the row decoder RD. The subword driver SWD located on an end of the memory cell array includes a plurality of drivers 6#1. The drivers 6#1 drive subword lines WL0, WL2, . . . of the subarray 1A in response to subdecoded signals obtained by decoding an address signal and the main word line MWL. The subword driver SWD located between the subarrays 1A and 1E includes a plurality of drivers 6#2. The drivers 6#2 drive subword lines WL1, WL3 . . . of the subarrays 1A and 1E in response to subdecoded signals obtained by decoding the address signal and the main word line MWL. The main word line MWL and the subword lines WL select rows of the subarrays.

Referring again to FIG. 1, each adjacent pair of subarrays share the sense amplifier block SB held therebetween (shared sense amplifier system). A read voltage of a small amplitude read from any subarray is amplified by either one of the two sense amplifier blocks SB holding this subarray therebetween.

Figure 3:
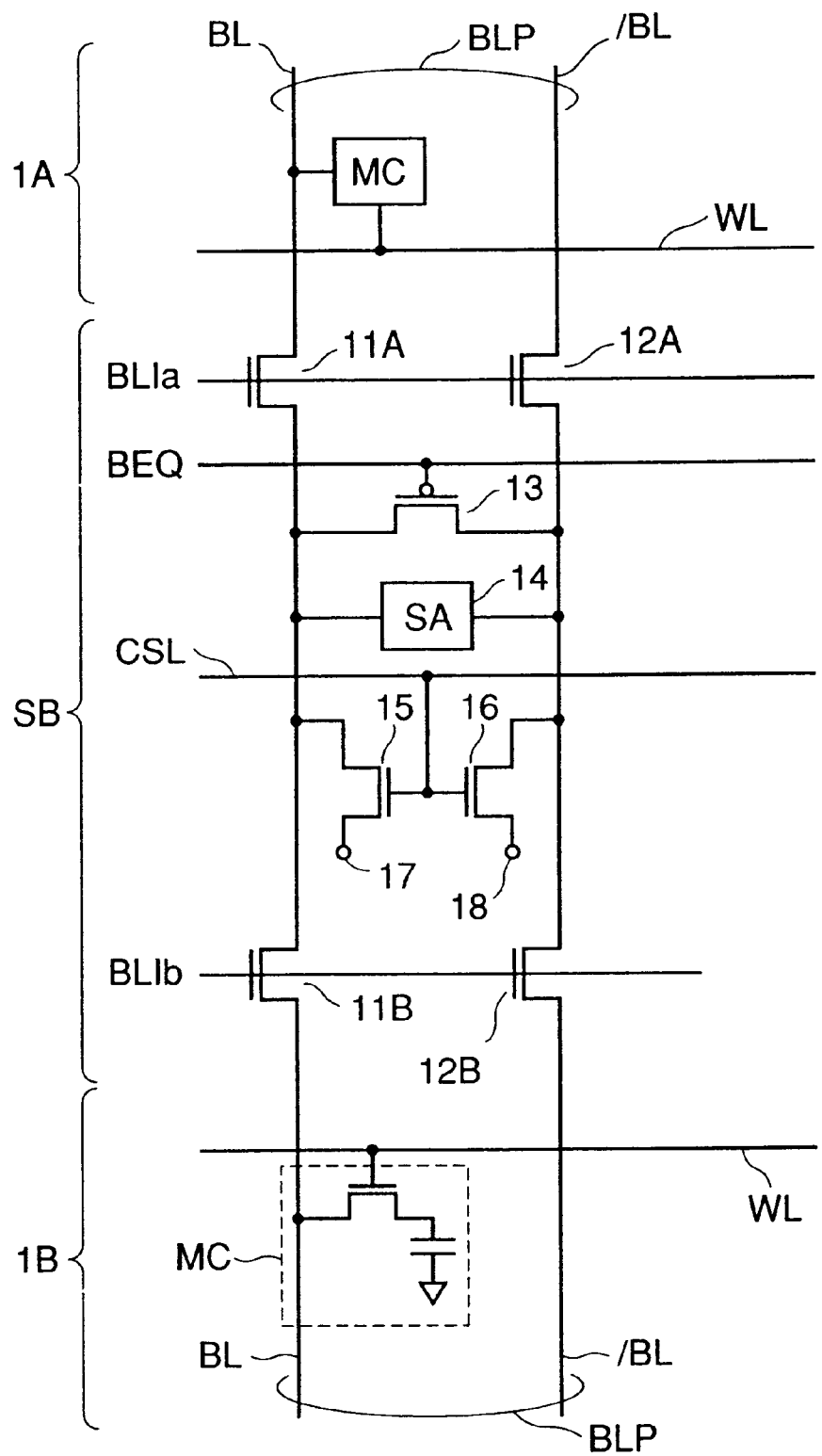
FIG. 3 is a diagram for illustrating the relation between subarrays and a sense amplifier block SB.

The relation between the subarrays and the sense amplifier block SB is described with reference to FIG. 3. FIG. 3 representatively illustrates the relation between a pair of bit lines BLP (bit lines BL and /BL) on the side of the subarray 1A, a pair of bit lines BLP (bit lines BL and /BL) on the side of the subarray 1B and the sense amplifier block SB. The sense amplifier block SB includes an equalizer circuit (transistor 13), a bit line separation circuit (transistors 1A, 11B, 12A and 12B), an I/O gate (transistors 15 and 16) and a sense amplifier SA. When a bit line equalize signal BEQ turns on the transistor 13, the pair of bit lines BLP (bit lines BL and /BL) on the side of the subarray 1A and the pair of bit lines BLP (bit lines BL and /BL) on the side of the subarray 1B are equalized to a prescribed potential.

When any subword line WL is selected, information is output from a memory cell MC connected thereto to the corresponding bit lines (BL and /BL in FIG. 3). When a bit line separation signal BLIa turns on the transistors 11A and 12A, the sense amplifier SA amplifies the potentials of the pair of bit lines BLP (bit lines BL and /BL) on the side of the subarray 1A. When a bit line separation signal BLIb turns on the transistors 11B and 12B, the sense amplifier SA amplifies the potentials of the pair of bit lines BLP (bit lines BL and /BL) on the side of the subarray 1B.

The transistors 15 and 16 are connected with the column selection line CSL, and first conducting terminals thereof are connected with an output of the sense amplifier SA respectively. Second conducting terminals 17 and 18 of the transistors 15 and 16 are connected with internal data buses respectively.

When the column selection line (column selection signal) CSL turns on the I/O gate in a read operation, a signal amplified in the sense amplifier SA is transmitted to the pair of internal data buses DBP. In a write operation, write data on the internal data buses DB are transmitted to the bit lines through the I/O gate.

Referring again to FIG. 1, the internal data buses DB are connected with the preamplifier/write driver 3. The preamplifier/write driver 3 includes a preamplifier for outputting the read data transmitted through the internal data buses DB to the external device and a write driver for transmitting externally received write data to the internal data buses. The preamplifier/write driver 3 is split into a plurality of circuits in correspondence to the internal data buses, and operation timings of the plurality of circuits are decided on the basis of the control signals received from the address-system circuit 2.

In the read operation, the I/O nodes SB output the read data output from the preamplifier/write driver 3 to the external device. In the write operation, the I/O nodes SB are externally supplied with the write data.

Figure 4:
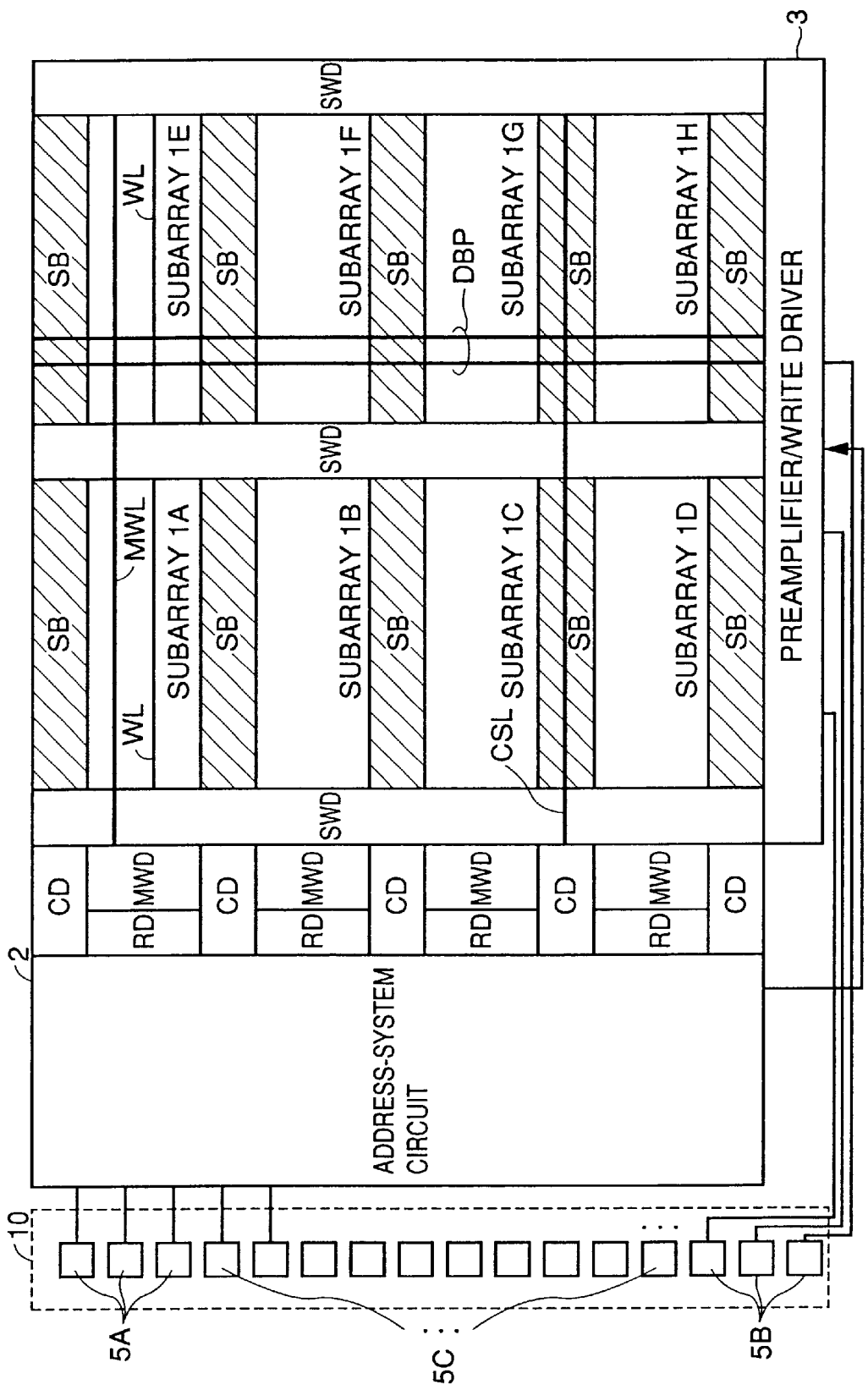
FIG. 4 is a diagram for illustrating a semiconductor memory device having internal data buses arranged in a column direction.

For the purpose of comparison, a semiconductor memory device having internal data buses arranged in a column direction is described with reference to FIG. 4. In general, the internal data buses are arranged in parallel with bit lines. When arranging the internal buses in the column direction in the semiconductor memory device shown in FIG. 1, therefore, a semiconductor memory device having the structure shown in FIG. 4 is obtained. In this case, the preamplifier/write driver 3 is arranged on an area different from that of the address-system circuit 2. Therefore, an interconnection connecting the preamplifier/write driver 3 and the address-system circuit 2 must be extended. Further, interconnections connecting the I/O nodes SB and the preamplifier/write driver 3 with each other must also be extended.

In the semiconductor memory device according to the first embodiment of the present invention, the address-system circuit 2 and the preamplifier/write driver 3 are arranged in the vicinity of the interface area 10, as shown in FIG. 1. The internal data buses are arranged in the row direction. Further, the control circuit 9 generating a command designating a circuit operation in response to an externally received control signal is arranged in the vicinity of the interface area 10.

Consequently, the length (signal transmission distance) of interconnections connecting the I/O nodes SB and the preamplifier/write driver 3 with each other is reduced. Thus, signal skew can be reduced, and this structure is particularly suitable to a memory having a large internal data bus width (large number of I/O nodes).

The preamplifier/write driver 3 and the address-system circuit 2 are arranged in parallel, whereby extension of an interconnection transmitting a control signal for the preamplifier/write driver 3 can be minimized. Further, the signal transmission distance between the control circuit 9 and the preamplifier/write driver 3 can be reduced.

Figure 16:
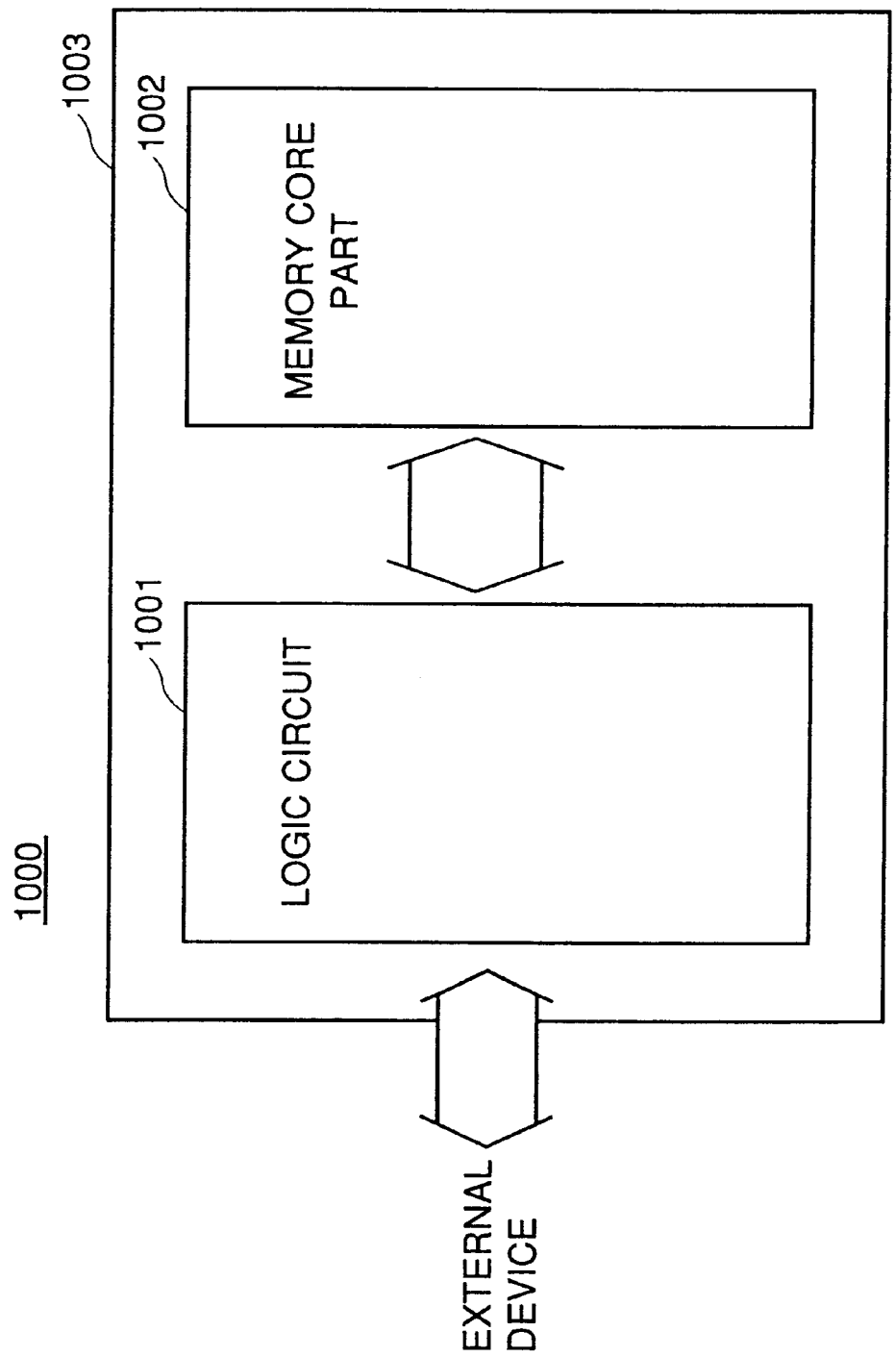
FIG. 16 illustrates a memory/logic merged LSI.

Therefore, only data writing in the memory cells, data reading from the memory cells, data delay on the internal data buses and data skew between the internal data buses may be correctly controlled. Thus, a memory core part 1002 having a wide operating margin and a high operating frequency can be implemented in a memory/logic merged LSI 1000 including a logic circuit 1002 and the memory core part 1002 formed on a single substrate 1003, as shown in FIG. 16.

Further, the internal data bus length is not influenced even if the size of the subarrays is elongated in the column direction (direction Y). This structure, which is independent of the size of the subarrays in the direction Y, is suitable for a memory array generator generating a variable memory array size.

Second Embodiment

Figure 5:
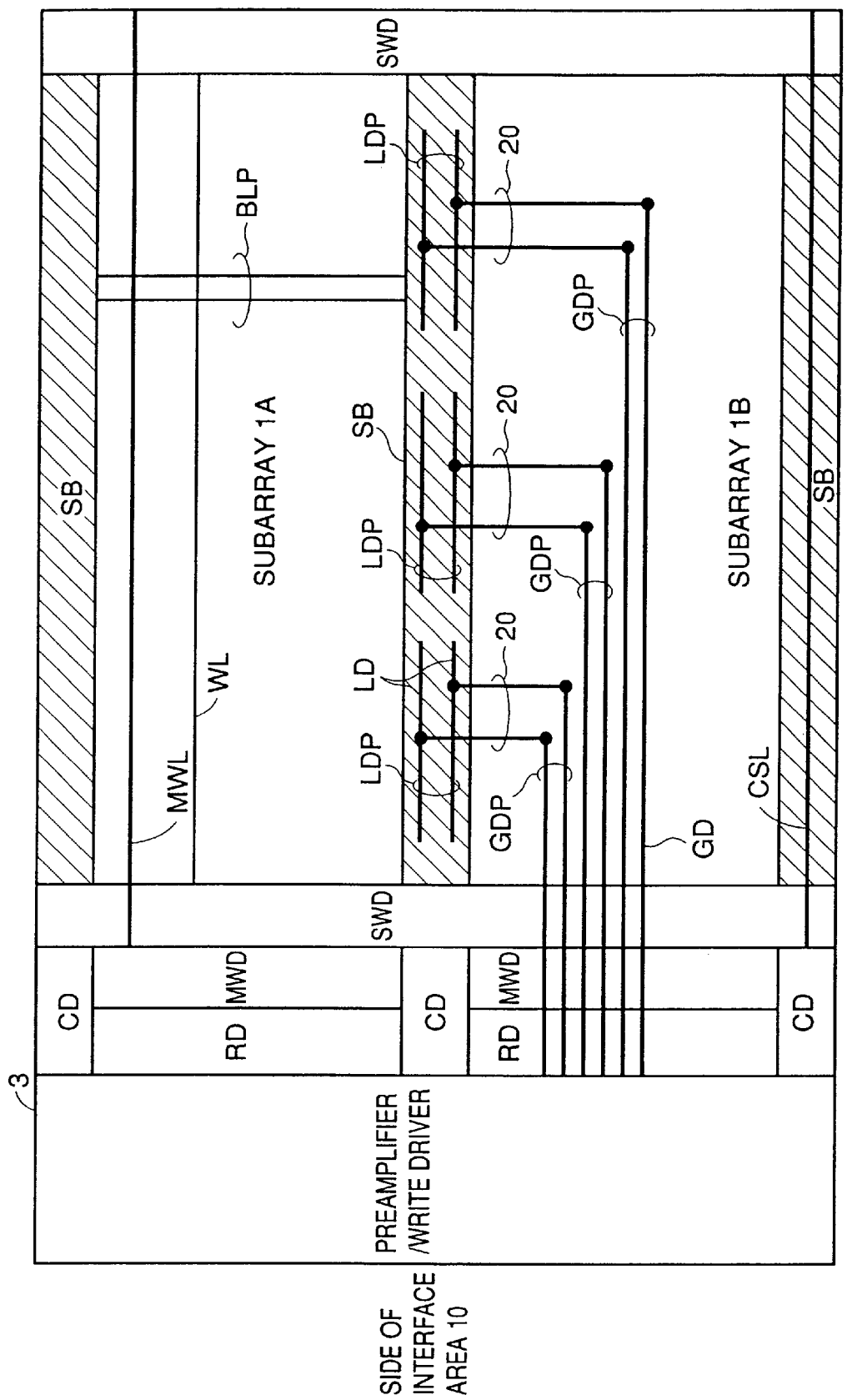
FIG. 5 is a diagram for illustrating an exemplary structure of internal data buses according to a second embodiment of the present invention.

An example for implementing the structure described with reference to the first embodiment of the present invention is described with reference to FIG. 5. FIG. 5 is a diagram for illustrating an exemplary structure of internal data buses according to a second embodiment of the present invention. FIG. 5 illustrates a memory cell array formed by subarrays 1A and 1B. The relation between an interface area 10 and internal circuits (an address-system circuit 2, a preamplifier/write driver 3, a control circuit 9 etc.) is as described with reference to the first embodiment. A shown in FIG. 5, the internal data buses are layered and formed by global data buses GD and local data buses LD.

Pairs of local data buses LDP formed by the local data buses LD are arranged on sense amplifier blocks SB in a row direction. FIG. 5 representatively illustrates three pairs of local data buses LDP arranged on a single sense amplifier block SB. Local data buses and global data buses are similarly arranged also for the remaining sense amplifier blocks SB. The number of the pairs of local data buses LDP depends on the number of I/O gates and the number of sense amplifiers.

The pairs of local data buses LDP arranged in the row direction are connected with pairs of bus connection lines 20 arranged in a column direction. The pairs of bus connection lines 20 are connected with pairs of global data buses GDP arranged in the row direction. The pairs of global data buses GDP are connected to the preamplifier/write driver 3.

A main word line MWL, the local data buses LD and a column selection line CSL are formed by first-layer metal interconnections respectively, and the pairs of bus connection lines 20 are formed by second layer metal interconnections. The global data buses GD are formed by third-layer metal interconnections, and a pair of bit lines BLP are formed by W-interconnections.

Figure 6:
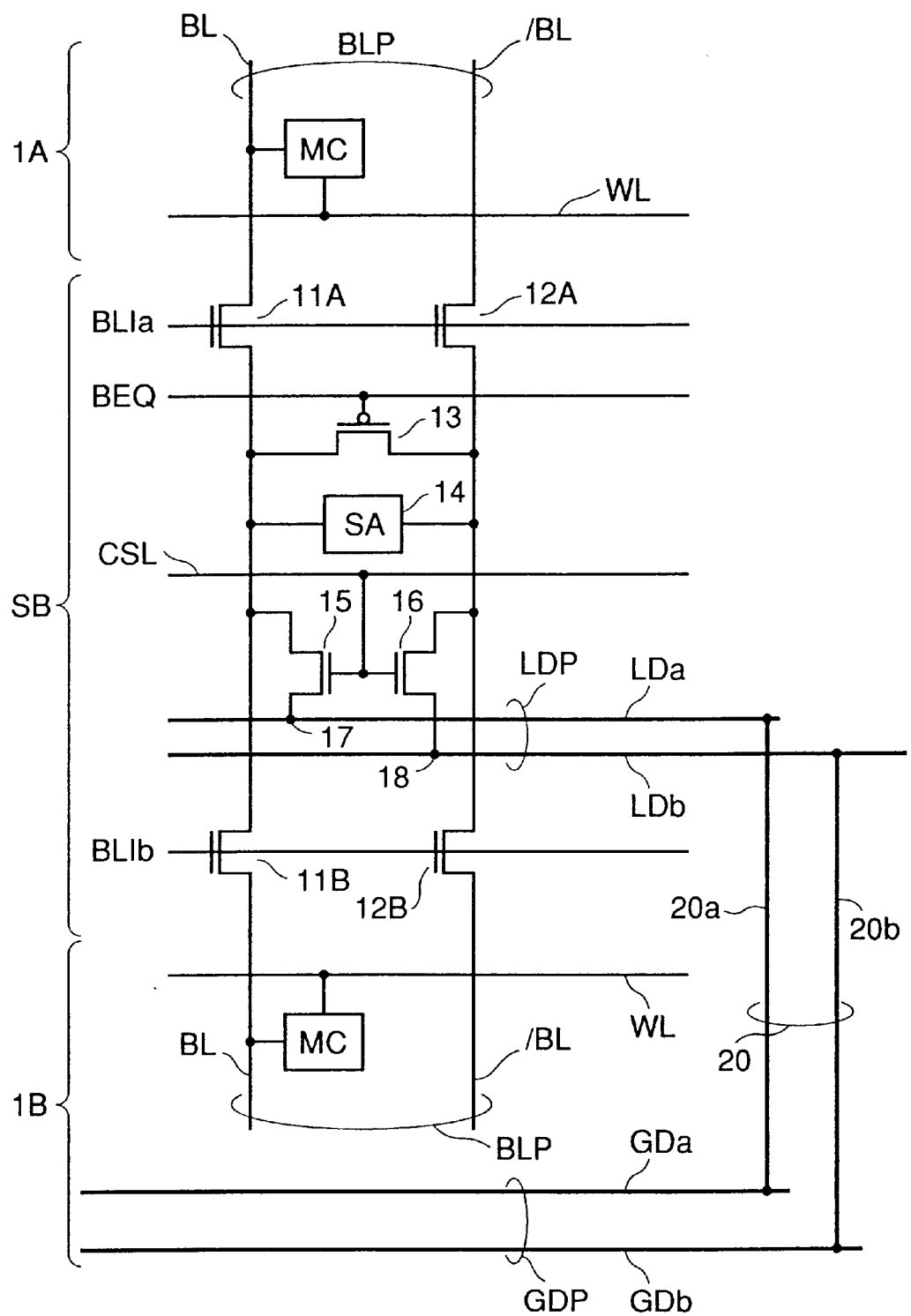
FIG. 6 is a diagram for illustrating coupling between a pair of local data buses LDP and a pair of global data buses GDP.

The coupling relation between the pair of local data buses LDP and the pair of global data buses GDP is described with reference to FIG. 6. Referring to FIG. 6, a first conducting terminal 17 of a transistor 15 is coupled with a local data bus LDa forming the pair of local data buses LDP, and a first conducting terminal 18 of another transistor 16 is coupled with another local data bus LDb forming the pair of local data buses LDP. The local data bus LDa is coupled with a bus connection line 20a forming the pair of bus connection lines 20, and the local data bus LDb is coupled with another bus connection line 20b forming the pair of bus connection lines 20. Further, a global data bus GDa forming the pair of global data buses GDP is coupled with the bus connection line 20a, and another global data bus GDb forming the pair of global data buses GDP is coupled with the bus connection line 20b. FIG. 6 shows an example coupling the pair of global data buses DGP with the pair of bus connection lines 20 on a subarray 1B.

Figure 7:
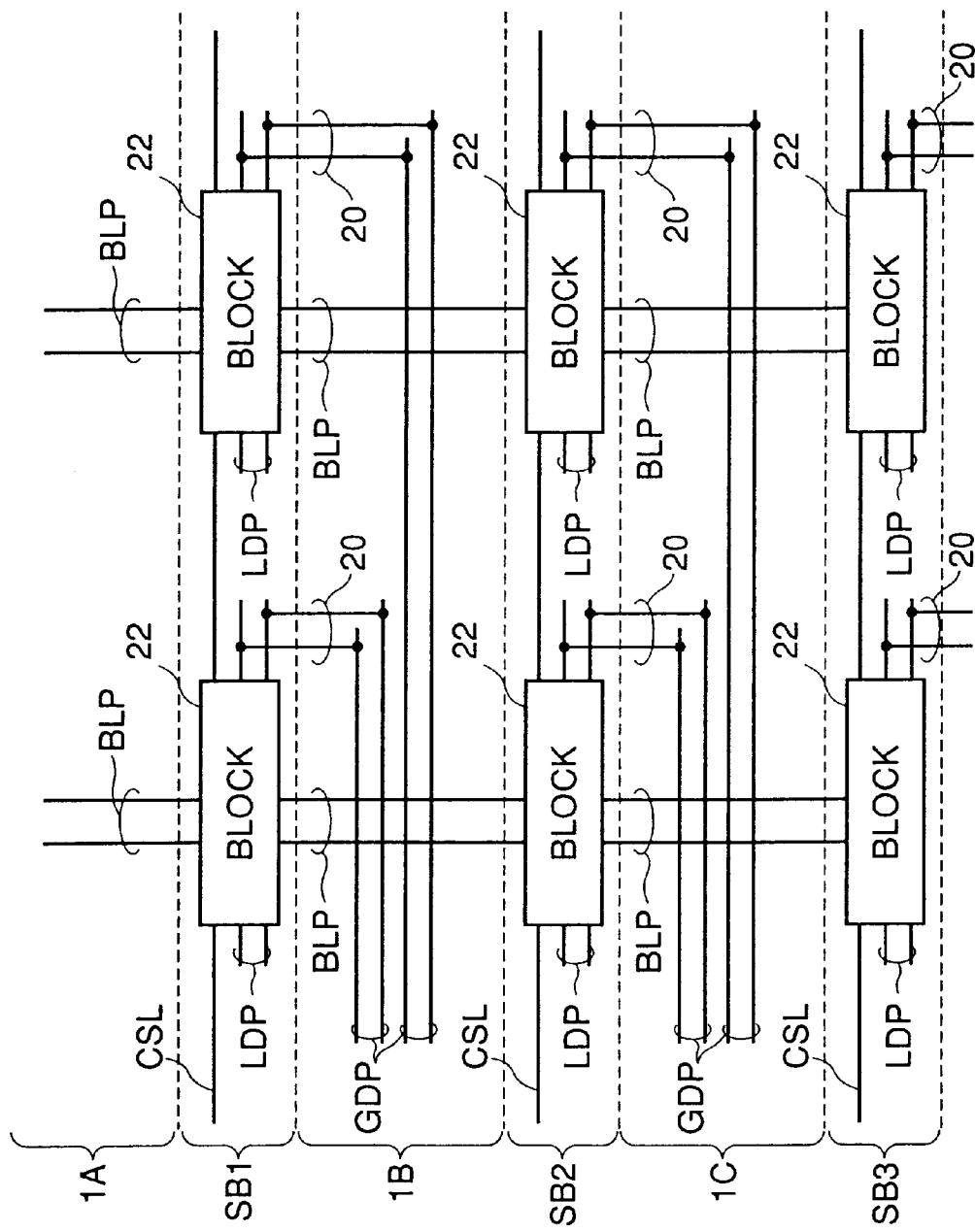
FIG. 7 is a diagram showing the relation between subarrays and the internal data buses.

The relation between subarrays and internal data buses is described with reference to FIG. 7. Symbols SB1, SB2 and SB3 denote sense amplifier blocks provided between subarrays 1A and 1B, between subarrays 1B and 1C and between subarrays 1C and 1D respectively. Each block 22 includes a plurality of sense amplifiers and a plurality of I/O gates corresponding to each pair of local data buses as well as other corresponding circuit elements.

For example, data on a pair of bit lines BLP in the subarray 1B are transmitted by the corresponding pair of global data buses GDP through the pair of local data buses LDP arranged on the sense amplifier block SB1 or SB2.

Referring again to FIG. 5, the global data buses GD pass through a row decoder area, and are connected to the preamplifier/write driver 3. The preamplifier/write driver 3 is arranged in the vicinity of the interface area 10 with the address-system circuit 2.

Thus, wiring delay between the preamplifier/write driver 3 and the address-system circuit 2, which are peripheral circuits, and the interface area 10 or skew of interconnections is minimized. Thus, delay in the memory cell array and the skew may be correctly controlled, whereby a memory core part (the block 1002 in FIG. 16) having a wide operating margin and a high operating frequency is implemented. Further, delay and skew in the column direction can be rendered common in each local control circuit, the address-system circuit 2, the preamplifier/write driver 3 and the control circuit therefore.

Third Embodiment

Figure 8:
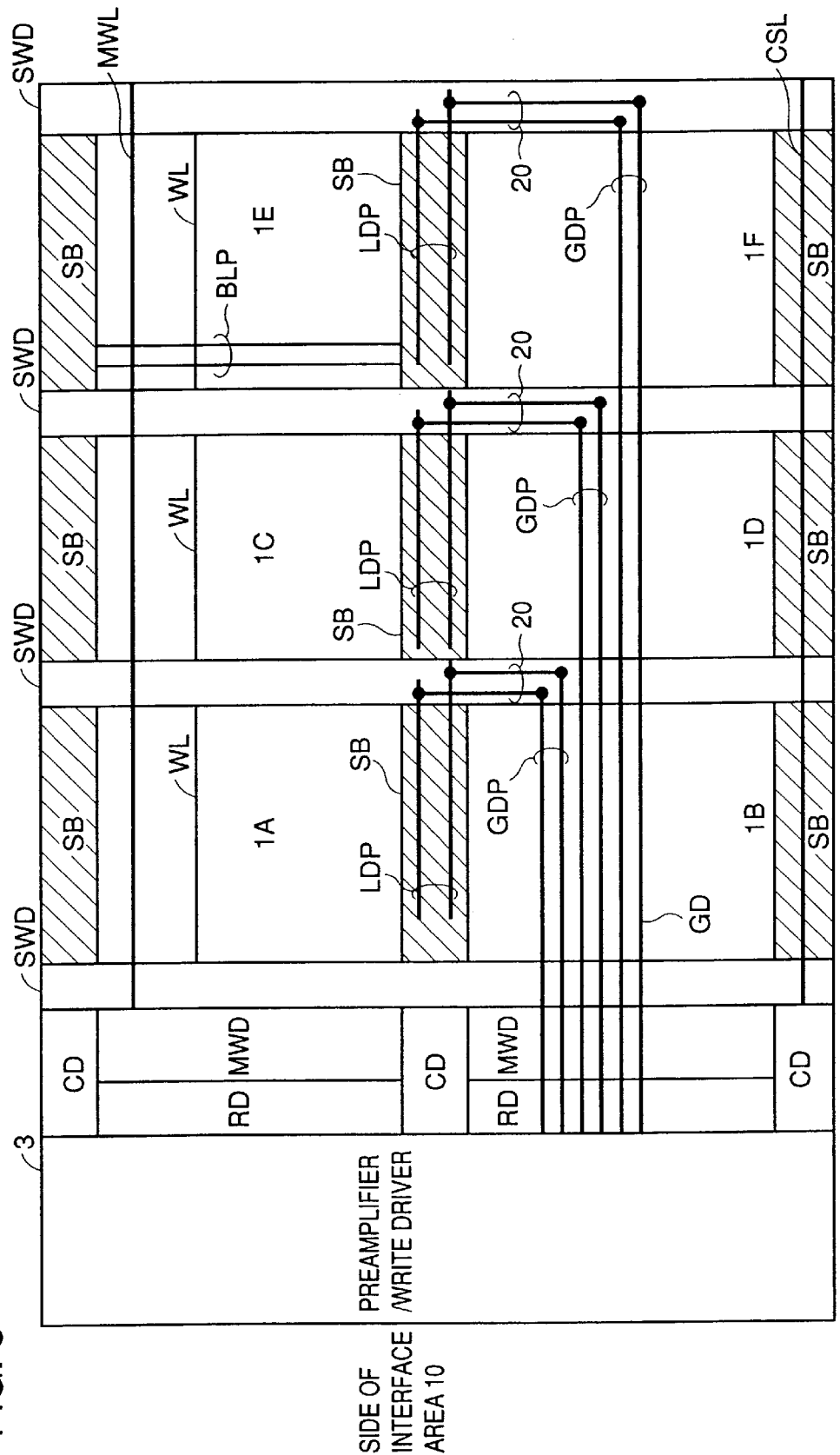
FIG. 8 is a diagram for illustrating exemplary arrangement of bus connection lines according to a third embodiment of the present invention.

Another exemplary arrangement of the bus connection lines described with reference to the second embodiment of the present invention is described. FIG. 8 is a diagram for illustrating exemplary arrangement of bus connection lines according to a third embodiment of the present invention. Referring to FIG. 8, a memory cell array is split into subarrays 1A to 1F. The relation between an interface area and internal circuits (an address-system circuit 2, a preamplifier/write driver 3, a control circuit 9 etc.) is as described with reference to the first embodiment. A main word line MWL, local data buses LD and a column selection line CSL are formed by first-layer metal interconnections respectively, and pairs of bus connection lines 20 are formed by second-layer metal interconnections. Global data buses GD are formed by third-layer metal interconnections, and a pair of bit lines BLP are formed by W-interconnections. FIG. 8 representatively illustrates three pairs of local data buses arranged on three sense amplifier blocks.

Subword drivers SWD are arranged on both ends of the memory array, a split area splitting subarrays 1A and 1B and subarrays 1C and 1D and a split area splitting the subarrays 1C and 1D and subarrays 1E and 1F respectively.

As shown in FIG. 8, the pairs of bus connection lines 20 connecting the pairs of local data buses and the pairs of global data buses are arranged on subword driver areas SWD. Thus, the bus connection lines can be arranged in a column direction through the subword driver areas SWD.

Figure 9:
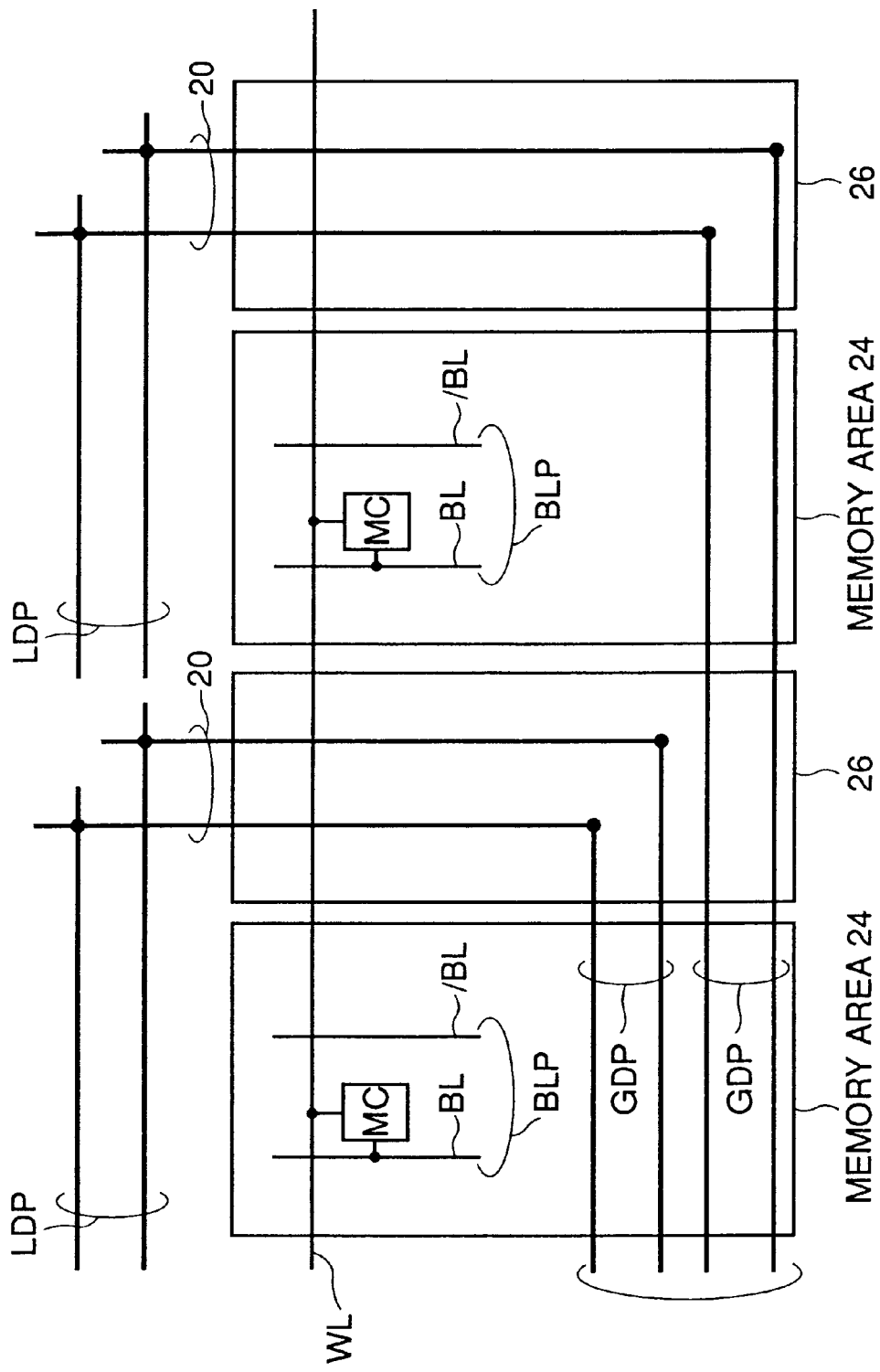
FIG. 9 is a diagram for illustrating another exemplary arrangement of bus connection lines according to the third embodiment of the present invention.

A structure having non-layered word lines is now described with reference to FIG. 9. FIG. 9 shows a memory cell array having a general word line structure. The memory cell array shown in FIG. 9 is split into a plurality of memory areas 24 by split areas 26. The split areas 26 are pile-driving areas (referred to as shunt areas 26) for pile-driving a word line WL. Pairs of bus connection lines 20 connecting pairs of local data buses and pairs of global data buses with each other are arranged on the shunt areas 26. Thus, the bus connection lines can be arranged in a column direction through the shunt areas 26.

In either case, wiring delay between the preamplifier/write driver 3 and the address-system circuit 2, which are peripheral circuits, and the interface area 10 or skew of interconnections is minimized. Further, delay and skew in the column direction can be rendered common in each local control circuit, the address-system circuit 2, the preamplifier/write driver 3 and the control circuit therefore.

Fourth Embodiment

The structure of a semiconductor memory device according to a fourth embodiment of the present invention is described. In the semiconductor memory device according to the fourth embodiment of the present invention, an address-system circuit group and a data-system circuit group (preamplifier/write driver 3 etc.) are arranged on different areas through a memory cell array. Following this, an interface area 10 is split into an interface area including address-system areas and an interface area including I/O-system areas, which in turn are arranged in the vicinity of corresponding circuits through the memory cell array respectively. Thus, performance for access etc. is improved.

Figure 10:
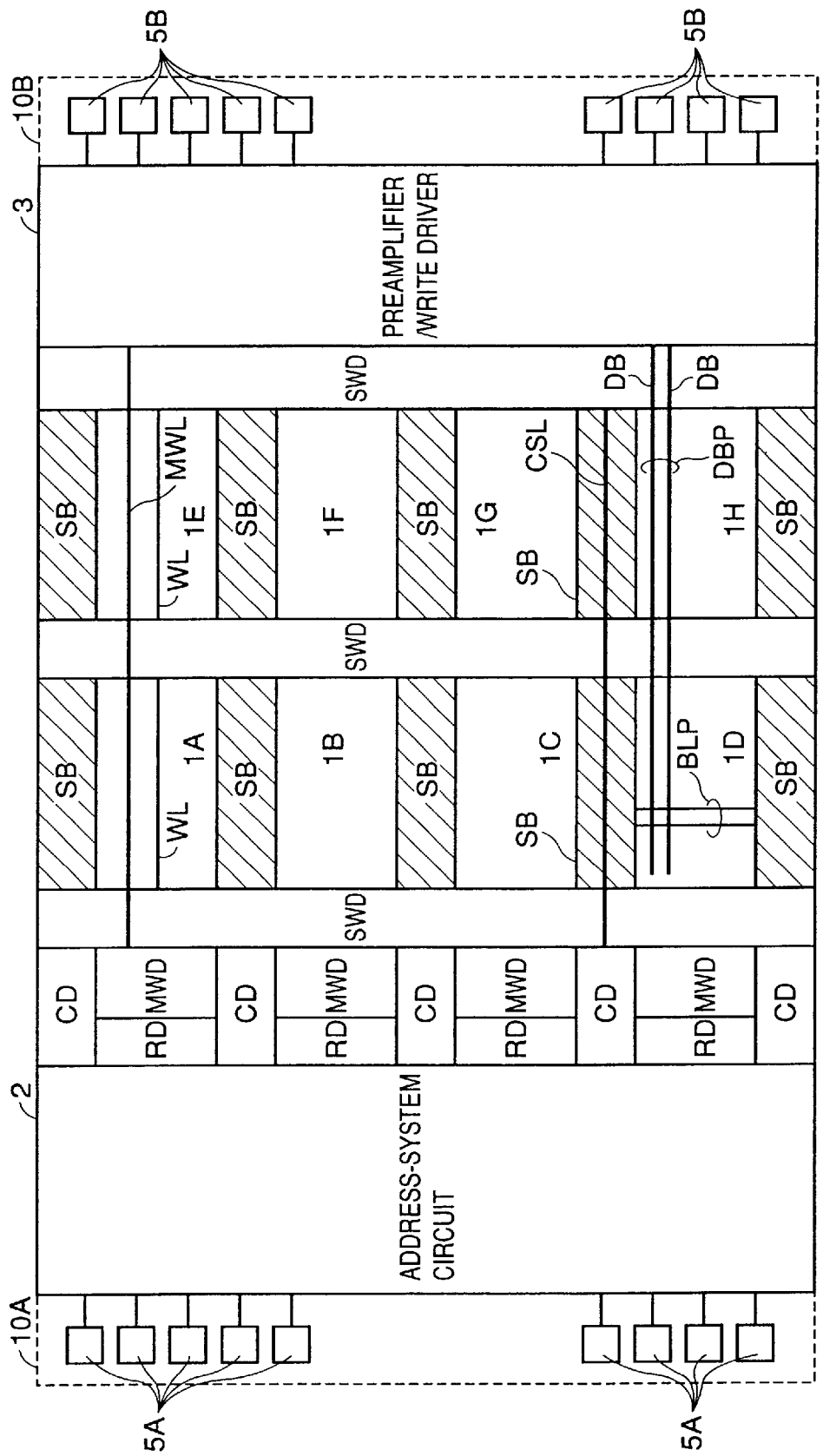
FIG. 10 is a diagram for illustrating an outline of the structure of a semiconductor memory device according to a fourth embodiment of the present invention.

The semiconductor memory device according to the fourth embodiment of the present invention is described with reference to FIG. 10. The semiconductor memory device shown in FIG. 10 comprises an interface area 10A including address nodes 5A and an interface area 10B including I/O nodes 5B. The interface areas 10A and 10B are arranged on both ends of a memory cell array. An address-system circuit 2, row decoders RD, column decoders CD and main word drivers MWD are arranged between the interface area 10A and the memory cell array, while a preamplifier/write driver 3 is arranged between the interface area 10B and the memory cell array. A specific structure of internal data buses shown in FIG. 10 is as described with reference to the second and third embodiments.

A memory cell (denoted by MC1) located in the vicinity of an address-system circuit group (the address-system circuit 2, the row decoders RD, the column decoders CD, word drivers WD etc.) and a memory cell (denoted by MC2) located in the vicinity of the preamplifier/write driver 3 are representatively described. In a read operation, the address-system circuit groups selects the memory cells in response to address signals input from the interface area 10A. Information read from the memory cells is transmitted to the preamplifier/write driver 3 through internal data buses DB arranged in a row direction.

At this time, signals necessary for selecting the memory cells and capturing the information from the selected memory cells flow from the address-system circuit group toward the preamplifier/write driver 3. Therefore, the information is read from the memory cell MC1 in advance of the information read from the memory cell MC2. The memory cell MC2 is closer to the preamplifier/write driver 3 than the memory cell MC1. The time necessary for the information read from the memory cell MC2 to reach the preamplifier/write driver 3 is shorter than that for the information read from the memory cell MC1.

In other words, the memory cell MC1 has small delay before addressing, with large delay on the internal data buses. The memory cell MC2 has large delay before addressing, with small delay on the internal data buses. Therefore, a structure minimizing wiring delay as a whole is implemented. Thus, high-speed reading is implemented in particular.

Fifth Embodiment

The structure of a semiconductor memory device according to a fifth embodiment of the present invention is described. The aforementioned semiconductor memory device according to the fourth embodiment implements a high-speed read operation. In a write operation, however, it takes time for write data output from the preamplifier/write driver 3 to arrive although the memory cell located in the vicinity of the address-system circuit group is addressed at a high speed. According to the fifth embodiment of the present invention, therefore, circuits related to a write operation in a data-system circuit group are arranged in the vicinity of an address-system circuit group.

Figure 11:
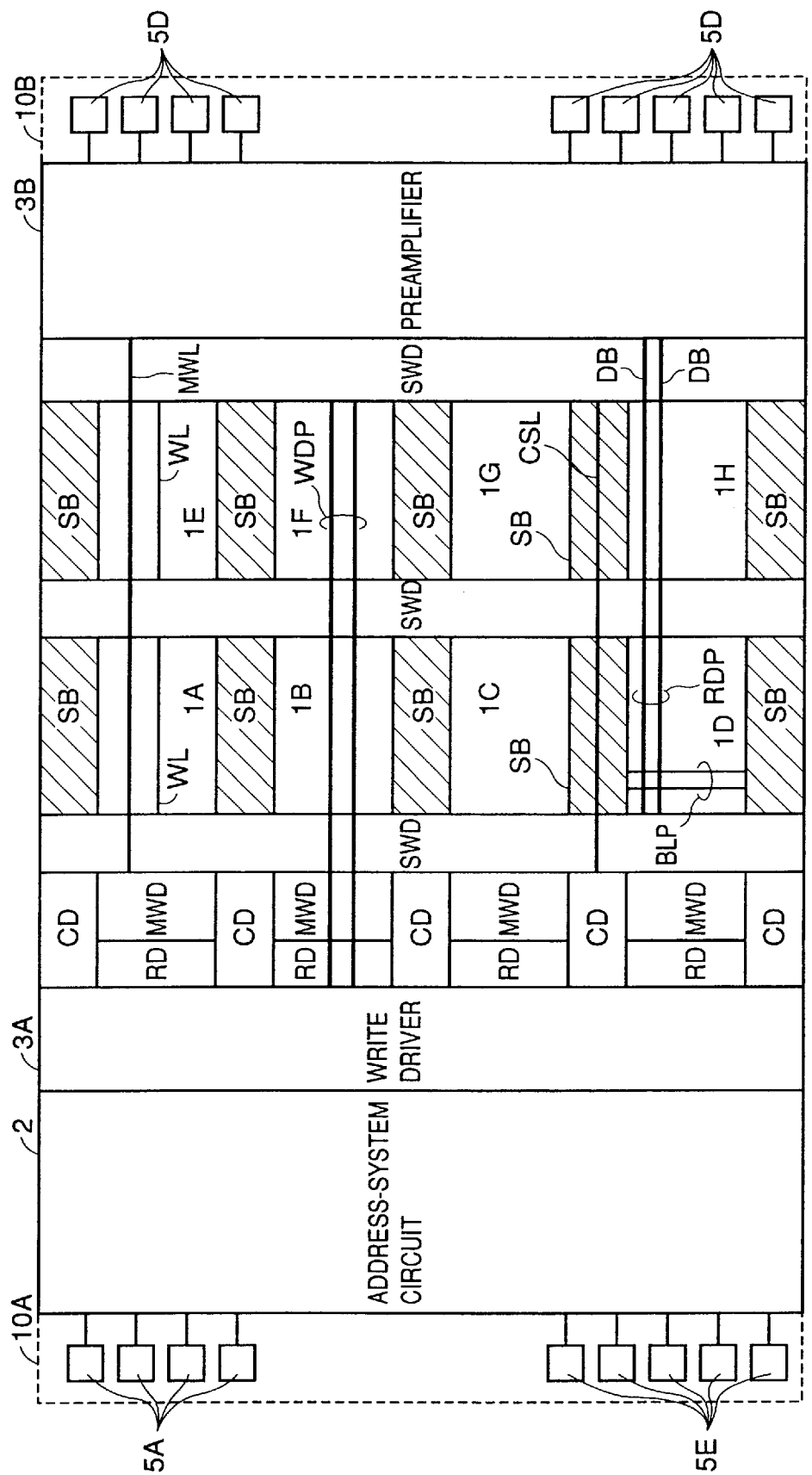
FIG. 11 is a diagram for illustrating an outline of the structure of a semiconductor memory device according to a fifth embodiment of the present invention.

The semiconductor memory device according to the fifth embodiment of the present invention is described with reference to FIG. 11. The semiconductor memory device shown in FIG. 11 comprises interface areas 10A and 10B. The interface area 10A includes address nodes 5A and areas (referred to as data input nodes 5E) receiving write data from an external device among I/O nodes 5B. The interface area 10B includes areas (referred to as data output nodes 5D) outputting read data among the I/O nodes 5B.

An address-system circuit 2, row decoders RD, column decoders CD, main word drivers MWD and a write driver 3A for amplifying write data received from the data input nodes 5E and transmitting the amplified write data to internal data buses arranged in a row direction are arranged between the interface area 10A and a memory cell array, while a preamplifier 3B for outputting read data read from the memory cell array to the external device is arranged between the interface area 10B and the memory cell array.

A pair of internal data buses are split into a pair of write data buses WDP arranged in the row direction and a pair of read data buses RDP arranged in the row direction. The pair of write data buses WDP transmit the write data output from the write driver 3A to memory cells. The pair of read data buses RDP transmit the read data to the preamplifier 3B.

As a specific structure of the pair of write data buses WDP and the pair of read data buses RDP, the structure (hierarchical structure) of the pairs of internal data buses described with reference to the first to third embodiments is applied. Each of the pair of write data buses WDP and the pair of read data buses RDP is formed by a pair of global data buses arranged in the row direction, a pair of local data buses arranged in the row direction and a pair of bus connection lines, arranged in a column direction, connecting the same with each other.

This structure enables a high-speed read operation similarly to the fourth embodiment. In relation to a write operation, memory cells located in the vicinity of the address-system circuit group have small delay before addressing with small delay on the internal data buses.

When also arranging areas receiving external control signals deciding internal operations on the interface area 10A, the performance is improved.

Sixth Embodiment

In each of the aforementioned first to fifth embodiments, the column selection line CSL is passed through the sense amplifier block SB. If the size of the memory cell array is increased in the row direction, however, the number of the I/O gates connected to the column selection line CSL is increased to increase the load capacity of the column selection line CSL. Such increase of the load capacity hinders a high-speed operation. According to a sixth embodiment of the present invention, therefore, the column selection line CSL is split into a plurality of lines thereby reducing the number of the controlled I/O gates.

Figure 12:
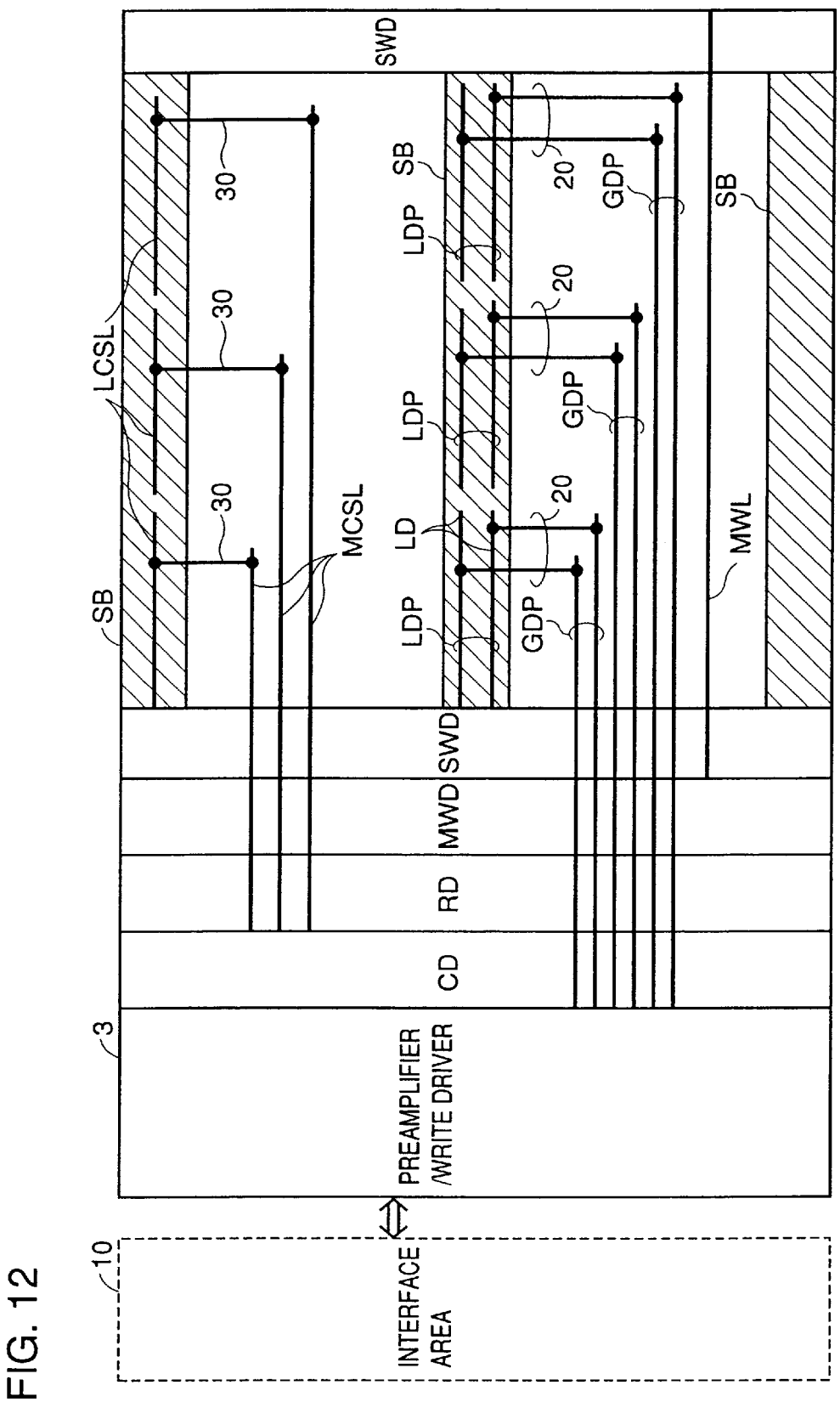
FIG. 12 is a diagram for illustrating an exemplary structure of column selection lines according to a sixth embodiment of the present invention.

An exemplary structure of the column selection line according to the sixth embodiment of the present invention is described with reference to FIG. 12. The relation between an interface area 10 and internal circuits (an address-system circuit 2, a preamplifier/write driver 3, a control circuit 9 etc.) is as described with reference to the first embodiment. As shown in FIG. 12, the column selection line is split into a plurality of local column selection lines LCSL, which are arranged in a sense amplifier block SB. FIG. 12 representatively illustrates three local column selection lines LCSL arranged on a single sense amplifier block SB. The local column selection lines LCSL open/close I/O gates (transistors 15 and 16) in place of the column selection line CSL described with reference to the first and second embodiments.

Each of the local column selection lines LCSL is connected with a main column selection line MCSL through a CSL connection line 30 arranged in a column direction. A column decoder CD drives the main column selection line MCSL.

A split column selection system can be implemented without increasing the area of the sense amplifier block SB by employing this structure. Consequently, the load capacity of the local column selection line LCSL is reduced, thereby enabling a high-speed operation.

In each of the first to fifth embodiments, a single column selection line CSL controls all I/O gates and hence the column decoder CD must be locally arranged on extension of the sense amplifier block SB. In the split column selection system according to the sixth embodiment, the main column selection line MCSL arranged on a memory cell array drives the local column selection lines LCSL, and hence the column decoder CD may not be locally arranged on extension of the sense amplifier block SB. As shown in FIG. 12, therefore, the column decoder CD, a row decoder RD, a main word driver MWD and the preamplifier/write driver 3 may be extended in a column direction. In other words, the internal circuits can be more readily laid out as compared with the first to fifth embodiments.

A main word line MWL, local data buses LD and the local column selection lines LCSL are formed by first-layer metal interconnections respectively, and pairs of bus connection lines 20 are formed by second layer metal interconnections. Global data buses GD are formed by thirdlayer metal wires, and pairs of bit lines BLP are formed by W-interconnections.

The main word line MWL and the main column selection lines MCSL, which are arranged in the row direction, may be arranged on the same layer or different layers.

Seventh Embodiment

Figure 13:
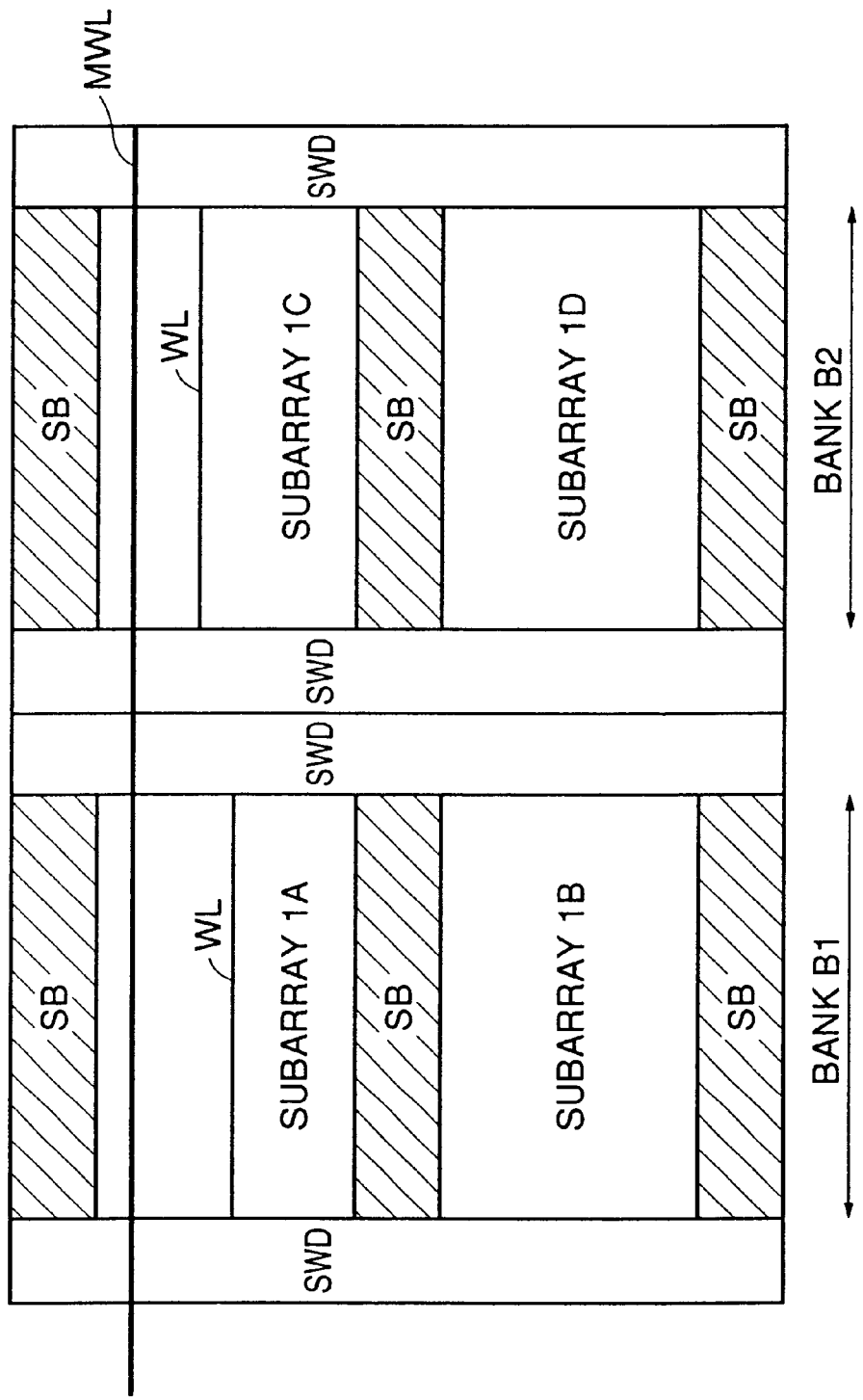
FIG. 13 illustrates a bank structure of a memory cell array according to a seventh embodiment of the present invention.

A semiconductor memory device according to a seventh embodiment of the present invention is described. In the seventh embodiment of the present invention, the aforementioned embodiment is applied to a bank structure. As shown in FIG. 13, a memory cell array according to the seventh embodiment of the present invention is formed by banks B1 and B2. The banks B1 and B2 can operate independently of each other.

The bank B1 includes subarrays 1A and 1B, and the bank B2 includes subarrays 1C and 1D. Three sense amplifier blocks SB are arranged for each bank. The subarrays 1A and 1B share the sense amplifier block SB held therebetween. The subarrays 1C and 1D share the sense amplifier block SB held therebetween.

Word lines are formed by a main word line MWL and subword lines WL (hierarchical structure). Two subword drivers SWD are arranged for each bank. Two subword drivers SWD holding the bank B1 therebetween select a row of the bank B1. Two subword drivers SWD holding the bank B2 therebetween select a row of the bank B2. The subword drivers SWB are formed by the aforementioned drivers 6#1, for example.

Figure 14:
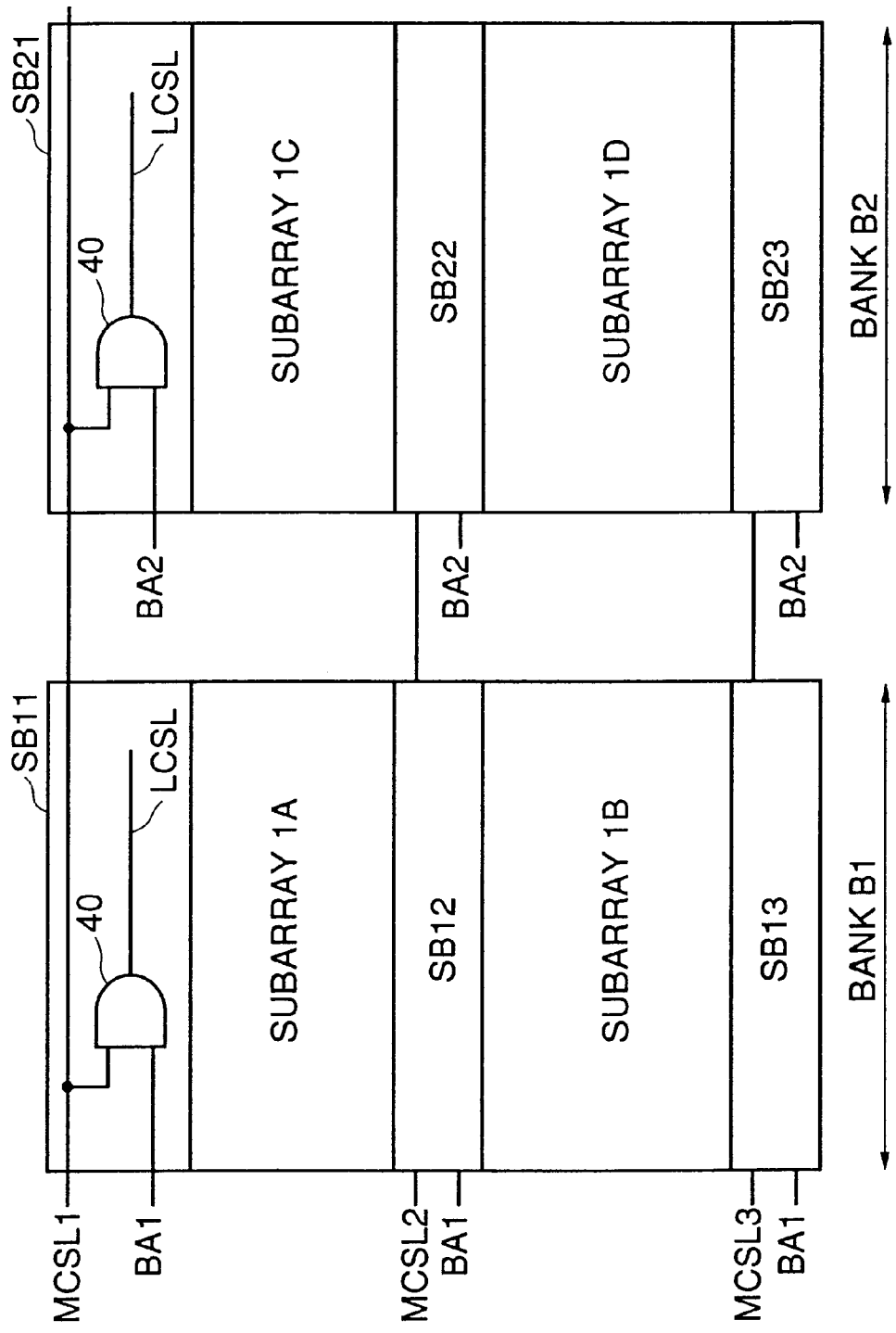
FIG. 14 is a diagram for illustrating the structure of column selection lines according to the seventh embodiment of the present invention.

As shown in FIG. 14, column selection lines CSL are formed by main column selection lines MCSL and local column selection lines LCSL (hierarchical structure). Referring to FIG. 14, symbols SB11, SB12 and SB13 denote sense amplifier blocks provided in correspondence to the bank B1, and symbols SB21, SB22 and SB23 denote sense amplifier blocks provided in correspondence to the bank B2. Symbol MCSL1 denotes the main column selection line provided in correspondence to the sense amplifier blocks SB11 and SB21, symbol MCSL2 denotes the main column selection line provided in correspondence to the sense amplifier blocks SB12 and SB22, and symbol MCSL3 denotes the main column selection line provided in correspondence to the sense amplifier blocks SB13 and SB23 respectively.

An AND circuit 40 is arranged for each sense amplifier block of each bank. The AND circuit 40 receives a bank selection signal (BA1 or BA2) for selecting the corresponding bank. The AND circuit 40 in the sense amplifier block SB11 drives the local column selection line LCSL in response to the potential of the main column selection line MCSL1 and the potential of the bank selection signal BA1. The value of the bank selection signal is decided on the basis of a bank address signal received in an address node 5A.

The local column selection line LCSL opens/closes an I/O gate in place of the column selection line CSL described with reference to the first and second embodiments. A column decoder CD drives the main column selection line MCSL.

Figure 15:
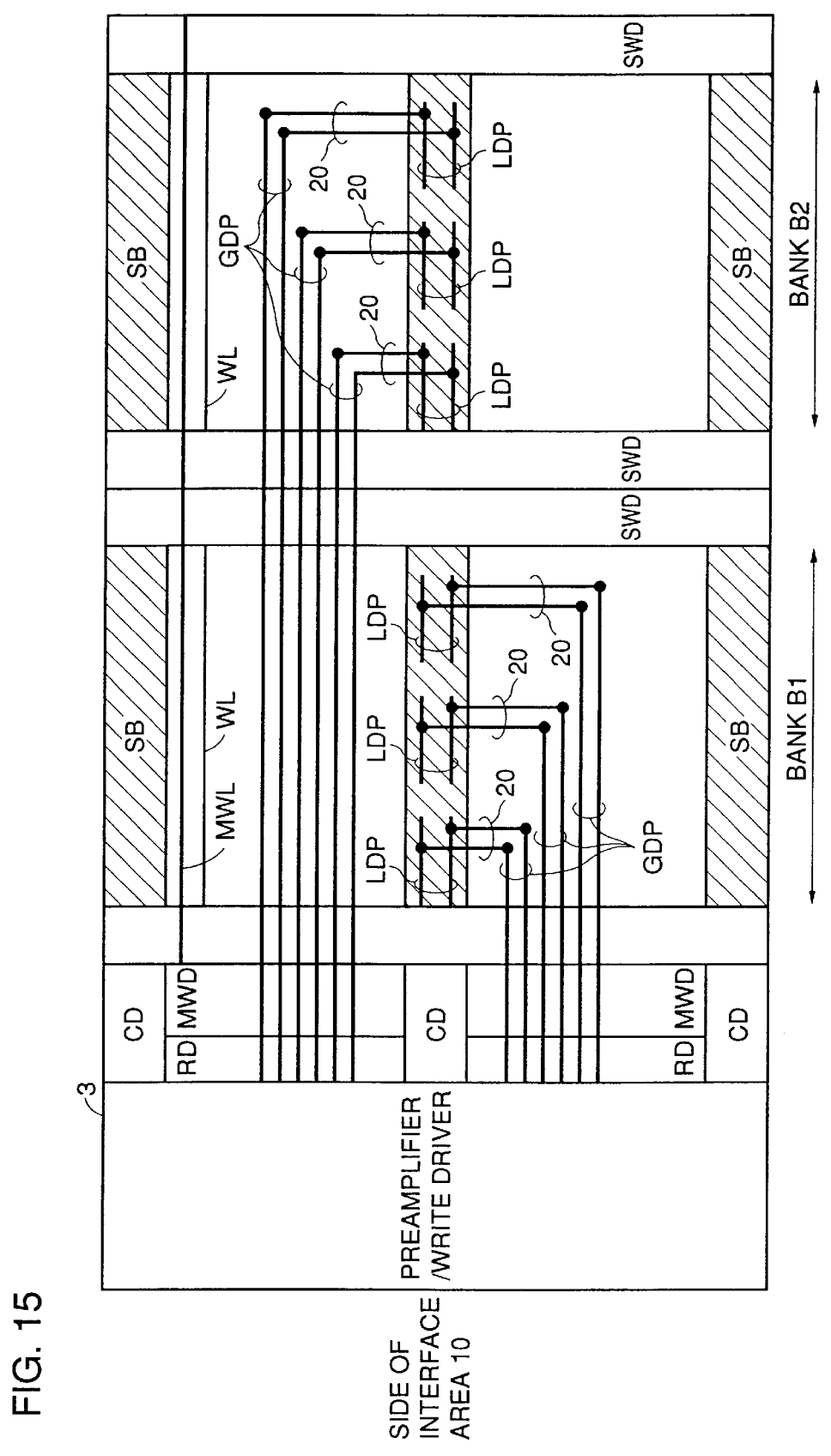

The structure of internal data buses in the semiconductor memory device including the aforementioned structure is described with reference to FIG. 15. FIG. 15 is a diagram for illustrating an exemplary structure of the internal data buses according to the seventh embodiment of the present invention. The relation between an interface area 10 and internal circuits is as described with reference to the first embodiment. As shown in FIG. 15, the internal data buses are formed by global data buses GD and local data buses LD (hierarchical structure).

Pairs of local data buses LDP are arranged on the sense amplifier blocks SB in the row direction. FIG. 15 illustrates three pairs of local data buses LDP arranged on a single sense amplifier block SB of each bank. Local data buses and global data buses are similarly arranged also for the remaining sense amplifier blocks SB.

As described above, the pairs of local data buses LDP arranged in the row direction are connected with pairs of bus connection lines 20 arranged in a column direction. The pairs of bus connection lines 20 are connected with pairs of global data buses GDP arranged in the row direction. The pairs of global data buses GDP are connected with a preamplifier/write driver 3.

A main word line MWL, the local data buses LD and column selection lines are formed by first-layer metal interconnections respectively, and the pairs of bus connection lines 20 are formed by second-layer metal interconnections. The global data buses GD are formed by third-layer metal interconnections, and pairs of bit lines BP are formed by double interconnections.

A large internal data width can be ensured also in a multi-bank structure due to the aforementioned structure, for implementing a high data transfer rate.

An active area of the memory array can be limited to a partial area (e.g., the subarray 1C of the bank B2) in a general operation, whereby the memory array can be activated in a more split manner, for reducing power consumption in the memory array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of word lines arranged in a row direction, a plurality of bit lines arranged in a column direction and a plurality of memory cells;
   an interface area for transmitting/receiving signals to/from an external device;
   a memory operation circuit arranged between said interface area and said memory cell array for writing data received from said interface area in said memory cell array and reading data from said memory cell array to output said data to said interface area;
   an internal data bus arranged in the row direction for transmitting write data output from said memory operation circuit in a write operation and transmitting read data read from said memory cell array to said memory operation circuit in a read operation; and
   a sense amplifier block including a plurality of sense amplifiers provided in correspondence to said plurality of bit lines respectively for amplifying the potentials of corresponding said bit lines and a plurality of input/output gates provided in correspondence to said plurality of bit lines respectively for electrically connecting/disconnecting corresponding said bit lines to/from said internal data bus,
   wherein said memory operation circuit includes:
      a selection circuit selecting a memory cell subjected to said write operation and said read operation on the basis of an address signal received from said interface area, and
      a data input/output circuit outputting said write data to said internal data bus on the basis of input data received from said interface area in said write operation and outputting output data to said interface area on the basis of said read data received from said internal data bus in said read operation.

2. A semiconductor memory device comprising:
   a memory cell array including a plurality of word lines arranged in a row direction, a plurality of bit lines arranged in a column direction and a plurality of memory cells;
   an interface area for transmitting/receiving signals to/from an external device;
   a memory operation circuit arranged between said interface area and said memory cell array for writing data received from said interface area in said memory cell array and reading data from said memory cell array to output said data to said interface area;
   an internal data bus arranged in the row direction for transmitting write data output from said memory operation circuit in a write operation and transmitting read data read from said memory cell array to said memory operation circuit in a read operation; and
   a sense amplifier block including a plurality of sense amplifiers provided in correspondence to said plurality of bit lines respectively for amplifying the potentials of corresponding said bit lines and a plurality of input/output gates provided in correspondence to said plurality of bit lines respectively for electrically connecting/disconnecting corresponding said bit lines to/from said internal data bus,
   wherein said memory operation circuit includes:
      a selection circuit selecting a memory cell subjected to said write operation and said read operation on the basis of an address signal received from said interface area, and
      a data input/output circuit outputting said write data to said internal data bus on the basis of input data received from said interface area in said write operation and outputting output data to said interface area on the basis of said read data received from said internal data bus in said read operation;
   said internal data bus includes:
      a local data bus arranged on said sense amplifier block and electrically connected with a bit line corresponding to said memory cell selected by said selection circuit, a global data bus arranged in the row direction and connected with said data input/output circuit, and a connection line connecting said local data bus and said global data bus with each other.

3. The semiconductor memory device according to claim 2, wherein said memory cell array includes:
a split area arranged in the column direction, and
a plurality of subarrays split by said split area, and
said connection line is arranged on said split area in the column direction.

4. The semiconductor memory device according to claim 3, wherein each of said plurality of word lines is split into a plurality of subword lines, and said split area is an area for driving the subword line corresponding to said selected memory cell.

5. The semiconductor memory device according to claim 3, wherein said split area is an area for pile-driving each of said plurality of word lines.

6. The semiconductor memory device according to claim 1, wherein said interface area includes:
a first interface area having an address area for receiving said address signal from said external device, and
a second interface area having a data input/output area for receiving said input data from said external device and outputting said output data to said external device, and
said selection circuit is arranged between said first interface area and an end of said memory cell array and said data input/output circuit is arranged between said second interface area and another end of said memory cell array.

7. The semiconductor memory device according to claim 1, wherein said interface area includes:
a first interface area having an address area for receiving said address signal from said external device and a data input area for receiving said input data from said external device, and
a second interface area having a data output area for outputting said output data to said external device,
said data input/output circuit includes:
a data input circuit outputting said write data to said internal data bus on the basis of said input data, and
a data output circuit outputting said output data to said data output area on the basis of said read data, and
said selection circuit and said data input circuit are arranged between said first interface area and an end of said memory cell array and said data output circuit is arranged between said second interface area and another end of said memory cell array.

8. The semiconductor memory device according to claim 7, wherein said internal data bus includes:
a write data bus provided in correspondence to said data input circuit for transmitting said write data, and
a read data bus provided in correspondence to said data output circuit for transmitting said read data.

9. The semiconductor memory device according to claim 1, wherein said plurality of input/output gates are split into a plurality of groups, said semiconductor memory device further comprising:
a plurality of local column selection lines provided in correspondence to said plurality of groups respectively for turning on/off said input/output gates included in corresponding said groups,
a plurality of main column selection lines provided in correspondence to said plurality of local column selection lines respectively and driven by said selection circuit, and
a plurality of connection lines for connecting said plurality of local column selection lines with corresponding said main column selection lines respectively.

10. The semiconductor memory device according to claim 1, wherein said memory cell array is split into a plurality of banks capable of operating independently of each other, and a plurality of said sense amplifier blocks and a plurality of said internal data buses are provided in correspondence to said plurality of banks respectively.

11. The semiconductor memory device according to claim 1, wherein said memory cell array is split into a plurality of banks capable of operating independently of each other, each of said plurality of banks is split into a plurality of subarrays, and a plurality of said sense amplifier blocks and a plurality of said internal data buses are provided in correspondence to said plurality of subarrays respectively.

12. A semiconductor memory device, comprising:

an array area including a plurality of memory cells arranged in a row direction, a plurality of word lines provided in correspondence to rows of said plurality of memory cells to extend in the row direction, a plurality of bit lines provided in correspondence to columns of said plurality of memory cells to extend in a column direction, and a sense amplifier block having a plurality of sense amplifiers provided in correspondence to said plurality of bit lines each for sensing and amplifying a potential of a corresponding bit line and a plurality of input/output gates arranged in the row direction for electrically connecting/disconnecting corresponding bit lines and an internal data bus;

an interface area arranged to extend in the column direction for transmitting/receiving signals to/from an external device;

a memory operation circuit arranged between said interface area and said array area to extend in the column direction, including a plurality of amplifier circuits for outputting data amplified by said plurality of sense amplifiers to said interface area;

said internal data bus arranged to extend in the row direction on said array area for transmitting the data amplified by said plurality of sense amplifiers to said plurality of amplifier circuits of said memory operation circuits; and a column selecting line arranged to extend in the row direction on said array area for selecting connection of said plurality of input/output gates.

* * * * *